(12) United States Patent
Uchiyama et al.

(10) Patent No.: US 6,660,536 B2
(45) Date of Patent: Dec. 9, 2003

(54) METHOD OF MAKING FERROELECTRIC MATERIAL UTILIZING ANNEAL IN AN ELECTRICAL FIELD

(75) Inventors: Kiyoshi Uchiyama, Colorado Springs, CO (US); Carlos A. Paz de Araujo, Colorado Springs, CO (US)

(73) Assignees: Symetrix Corporation, Colorado Springs, CO (US); Matsushita Electric Industrial Co., Ltd. (JP)

(*) Notice: Subject to any disclaimer, the term of this patent is extended or adjusted under 35 U.S.C. 154(b) by 0 days.

(21) Appl. No.: 10/080,383

(22) Filed: Feb. 21, 2002

(65) Prior Publication Data

US 2003/0157766 A1 Aug. 21, 2003

(51) Int. Cl.[7] .................... H01L 21/00; H01L 21/8238; H01L 21/8242; H01L 21/31
(52) U.S. Cl. .................... 438/3; 438/216; 438/240; 438/785
(58) Field of Search .................... 438/3, 216, 240, 438/789

(56) References Cited

U.S. PATENT DOCUMENTS 4,027,074 A * 5/1977 Cross et al. ................ 428/450
5,626,670 A * 5/1997 Varshney et al. ............ 117/7
5,688,565 A   11/1997 McMillan et al. .......... 427/565

FOREIGN PATENT DOCUMENTS

JP    09-232532   *  9/1997

* cited by examiner

Primary Examiner—W. David Coleman
Assistant Examiner—William M. Brewster
(74) Attorney, Agent, or Firm—Patton Boggs LLP

(57) ABSTRACT

A ferroelectric thin film precursor material is annealed while in an electric field. The electric field is maintained as the material cools. A partially completed integrated circuit with a ferroelectric thin film precursor material may be placed between two electrodes in an annealing apparatus and voltage sufficient to polarize the ferroelectric thin film material in the direction of the electrical field is supplied to the electrodes during the anneal and as the film cools. Alternatively, probes are connected to the electrodes of a partially completed integrated circuit device and voltage sufficient to polarize the ferroelectric material is applied while annealing the material and as it cools. The anneal may be a furnace anneal or an RTP anneal.

37 Claims, 4 Drawing Sheets

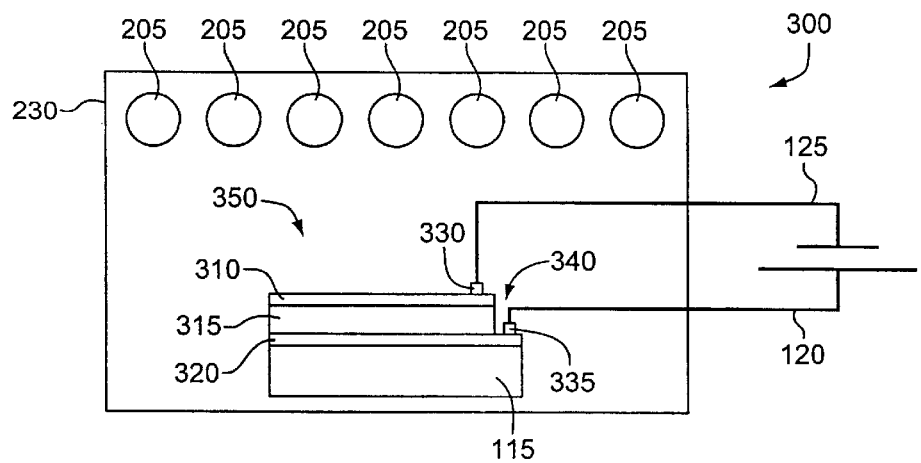
FIG. 3
FIG. 4A
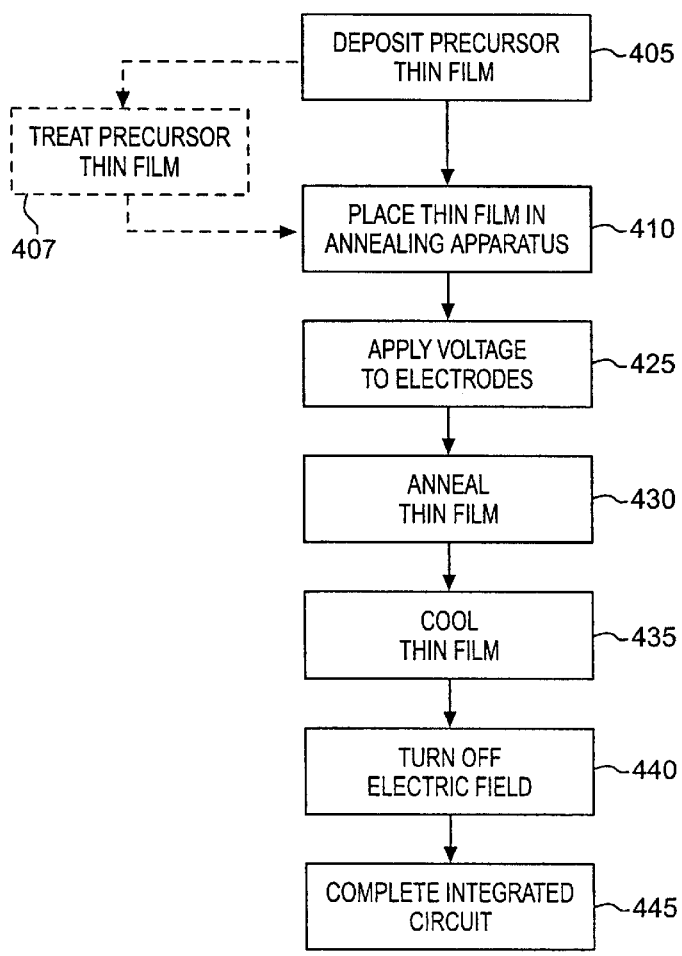

METHOD OF MAKING FERROELECTRIC MATERIAL UTILIZING ANNEAL IN AN ELECTRICAL FIELD

BACKGROUND OF THE INVENTION

1. Field of the Invention

The invention in general relates to the fabrication of ferroelectric materials, and more particularly to annealing a layered superlattice material in an electrical field to provide low fatigue ferroelectric and reliable high dielectric constant integrated circuit devices that are unusually resistant to degradation.

2. Statement of the Problem

Ferroelectric materials can be used in electronic memories. A ferroelectric material is a material with permanent charge dipoles that rise from asymmetries in the crystal structure. The respective positive and negative polarization states can be used to store information by substituting a ferroelectric material for the dielectric capacitor material of a conventional DRAM capacitor circuit. Still, ferroelectric memory densities are limited by the magnitude of polarization that may be obtained from the ferroelectric material. The polarization is the amount of charge associated with the dipolar or free charge in a ferroelectric material. For dipoles, the direction of the polarization is the direction of the dipole. The polarization is equal to the external charge which must be supplied to the material to produce a polarized state from a random state. Once ferroelectric material is polarized, either positive or negative, the material requires approximately twice the amount of external charge to reverse the polarization.

Prior thin film ferroelectric materials typically have high polarization fatigue rates that make them unreliable in long term use because the magnitude of polarization decreases with use. Eventually, the control logic that is coupled with known ferroelectric materials will be unable to read the fatigued polarization state of the materials and, therefore, unable to store or retrieve bits of information.

Ferroelectric layered perovskite-like materials, perhaps better known as layered superlattice materials, are known which have much better resistance to fatigue than prior ferroelectric materials. The term "perovskite-like" usually refers to a number of interconnected oxygen octahedra. A primary cell is typically formed of an oxygen octahedral positioned within a cube that is defined by large A-site metals where the oxygen atoms occupy the planar face centers of the cube and a small B-site element occupies the center of the cube.

Prior layered superlattice materials typically have high dielectric constants, and can be used as conventional dielectrics. Even so, too high of a leakage current makes these materials not optimally suited for use as a dense dielectric memory because the charged or uncharged state of the dielectric capacitor circuit must be too frequently detected and refreshed. Leakage current and long term reliability currently present a significant obstacle in research toward further densification of integrated circuit memories.

Hysteresis curves are used to plot the measured charge versus the voltage applied in ferroelectric materials. When the electric field is applied across a ferroelectric material, the polarization can lag behind. When the electric field is applied to ferroelectric material, from positive voltage to negative voltage, the hysteresis plots an elliptical figure if the material exhibits a memory capacity. In a typical hysteresis curve, the voltage applied is measured and plotted on the x-axis with the x-y intersect equaling zero voltage. The measured charge is plotted on the y-axis of the hysteresis curve with the zero measured charge equaling the x-y intersect. As the voltage is cycled from positive to negative voltage, the remnant polarization (Pr) is measured in both the positive cycle and the negative cycle when the voltage equals zero. These polarizations are Pr or −Pr and is the remnant polarization in the ferroelectric material at a zero field value. The Pr and −Pr values ideally have the same magnitude, but the values are most often different in practice. Thus, polarization measured as 2Pr is calculated by adding the absolute values of the actual Pr and −Pr values even though these values may differ in magnitude.

The polarization charge 2Pr is the charge created by switching a capacitor from a state where it is fully polarized in one direction, say the upward vertical direction, to the opposite fully polarized state, which would be the downward vertical direction. An integrated circuit containing a ferroelectric material device, such as a ferroelectric random access memory or a ferroelectric capacitor, stores a charge and, when read by the logic circuit of an electronic instrument or device, returns a zero or a one depending on the polarization state of the ferroelectric material device. When a ferroelectric material device is read millions of times, the polarization value of the ferroelectric material device can change. The greater the 2Pr value the less likely the ferroelectric material device will change polarization states during these numerous read cycles.

It is difficult to find ferroelectric materials that meet commercial requirements. The best materials for integrated ferroelectric devices are switched using a coercive field that can be obtained from conventional integrated circuit operating voltages, i.e., three to five volts. The materials should have a very high polarization, e.g., one exceeding twelve to fifteen $\mu C/cm^2$ determined as 2Pr, to permit the construction of memories having sufficient densities. While materials with both a suitable coercive field and a high value of 2Pr have been obtained in the laboratory, producing such materials consistently in a commercial environment has been difficult.

As a ferroelectric material device is switched repeatedly, the ferroelectric material fatigues and the plot of 2Pr on the hysteresis curve narrows. This decrease or narrowing of the hysteresis curve is due to the creation of point charge defects arising in the ferroelectric material as a consequence of polarization switching and the associated screening effect of the defects on the applied field, and is generally referred to as "fatigue". This fatigue causes the ferroelectric material to wear out over time due to repeated polarization switching. Generally, commercial materials that have the best 2Pr and coercive field tend to have too much fatigue, and vice-versa. Thus, there remains a need for thin film ferroelectric materials that possess a high 2Pr value, a coercive field that permits switching in the two to five volt range, and are more resistant to fatigue.

Solution

The present invention overcomes the problem of fatigue and too high leakage current by annealing the ferroelectric material or precursor thereof in the presence of an electric field. In another aspect, the invention overcomes the above problems by applying an electric field to an annealed ferroelectric material as it cools. Preferably, this results in polarizing the direction of the ferroelectric materials in the electrical field direction. This insures a greater 2Pr value by increasing the domain of the ferroelectric thin film material, and thereby increasing the 2Pr value. The aligned ferroelectric thin film material also provides a good coercive field and better fatigue properties.

Broadly speaking, the fabrication process includes the acts of providing an integrated circuit substrate comprising a thin film precursor and annealing the thin film precursor in the presence of an electrical field. The thin film precursor can comprise either a liquid coating, an amorphous precursor material to the ferroelectric material or a crystallized ferroelectric material. In one embodiment of the invention, voltage is applied to electrodes placed in close proximity to the precursor thin film. In a second embodiment of the invention, voltage is applied to electrodes in close proximity to the precursor thin film during the annealing process of the precursor thin film in a rapid thermal annealing apparatus. In a third embodiment of the invention, the integrated circuit substrate of the ferroelectric thin film material is deposited adjacent to a first electrode and then a second electrode is deposited onto the integrated circuit substrate, probes are connected directly to the electrodes of the integrated circuit substrate, and voltage is supplied to the electrodes via the probes. Preferably, in this third embodiment, the ferroelectric thin film material is preannealed prior to depositing the second electrode. Preferably, in all three embodiments, the electric field is sufficient to polarize the resultant ferroelectric material in the direction of the electrical field.

The invention provides a method of fabricating an integrated circuit, the method comprising the acts of: (a) providing an integrated circuit substrate; (b) depositing a precursor thin film on the integrated circuit substrate, the precursor thin film comprising either a ferroelectric material or a precursor to a ferroelectric material; (c) applying an electric field to the precursor thin film; (d) annealing the precursor thin film during the application of the electric field to form a solid ferroelectric thin film; and (e) completing the fabrication of the integrated circuit to include at least a portion of the solid ferroelectric thin film in an electrical component of the integrated circuit. Preferably, the solid ferroelectric thin film is an active material in the integrated circuit. Preferably, the act of applying an electric field comprises creating an electric field sufficient to align the polarization direction of the ferroelectric thin film with the electric field. Preferably, the act of annealing comprises heating the precursor thin film to a temperature above the crystallization temperature of the ferroelectric material. Preferably the act of annealing comprises heating the precursor thin film to a temperature above the Curie temperature of the ferroelectric material. In an alternative embodiment, the act of annealing comprises heating the precursor thin film to a temperature below the Curie temperature of the ferroelectric material. Preferably, the method further includes the act of cooling the ferroelectric thin film below the crystallization temperature of the ferroelectric material while applying the electric field. Preferably, said act of annealing comprises annealing in a furnace. Preferably, the act of annealing comprises annealing in a rapid thermal anneal apparatus. Preferably, the integrated circuit comprises a ferroelectric memory. Preferably, the ferroelectric memory comprises a ferroelectric capacitor. Preferably, the ferroelectric memory comprises a ferroelectric field effect transistor.

In another aspect, the invention provides a method of fabricating an integrated circuit, said method comprising: annealing the ferroelectric material or precursor to the ferroelectric material; and applying an electric field to the annealed ferroelectric material as it cools. Preferably, the electric field is applied until the film cools to the Curie temperature of the ferroelectric thin film or below. Preferably, the electric field is applied until the film cools to the crystallization temperature of the ferroelectric thin film or below. Preferably, the electric field is applied until the film cools to room temperature. Preferably, the act of applying comprises creating an electric field sufficient to align the polarization direction of the ferroelectric thin film with the electric field. Preferably, the act of annealing comprises heating the precursor thin film to a temperature above the crystallization temperature of the ferroelectric material. Preferably, the act of annealing comprises heating the precursor thin film to a temperature above the Curie temperature of the ferroelectric material. Alternatively, the act of annealing comprises heating said precursor thin film to a temperature below the Curie temperature of said ferroelectric material. Preferably, the precursor to the ferroelectric material is a solid. Preferably, the precursor to the ferroelectric material is a liquid. Preferably, the act of annealing comprises annealing in a furnace. Preferably, the act of annealing comprises annealing in a rapid thermal anneal apparatus.

Other features, objects and advantages will become apparent to those skilled in the art upon reading the detailed description below in combination with the accompanying drawings.

BRIEF DESCRIPTION OF THE DRAWINGS

FIG. 3 shows an exemplary embodiment of an annealing device according to the invention;

FIG. 4A is a flow chart showing an embodiment of a process for annealing a thin film ferroelectric material according to the invention;

DETAILED DESCRIPTION OF THE PREFERRED EMBODIMENT

According to the primary aspect of the present invention, a ferroelectric thin film material is annealed in the presence of an electrical field which preferably is sufficient to align the polarization direction of the ferroelectric material with the electrical field, thereby increasing the 2Pr value of the ferroelectric thin film material. Specifically, the present invention preferably embodies a method for annealing the ferroelectric thin film material while applying a voltage to electrodes in close proximity to the ferroelectric thin film material in a furnace. In addition, the present invention preferably embodies a method for annealing the ferroelectric thin film material while applying a voltage to electrodes in close proximity to the ferroelectric thin film material in a rapid thermal anneal apparatus. Further, another embodiment of the present invention provides a method for annealing a ferroelectric thin film material device containing a first and a second electrode, whereby probes are electrically connected to the first and second electrodes and voltage is supplied to the electrodes via the probes while the device is being annealed in a furnace. In addition, another embodiment of the present invention provides a method for annealing a ferroelectric thin film material device containing a first and a second electrode; whereby probes are electrically connected to the first and second electrodes and voltage is supplied to the electrodes via the probes while the device is being annealed in a rapid thermal annealing apparatus.

The term "thin film" herein means a thin film of a thickness appropriate to be used in an integrated circuit. Such thin films are less than 1 micron in thickness. Preferably, they are in the range of 20 nanometers (nm) to 500 nm. It is important to distinguish this term from the same term, i.e. "thin film", as used in essentially macroscopic arts, such as optics, where "thin film" means a film over 1 micron, and usually from 2 to 100 microns. Such macroscopic "thin films" are hundreds to thousands of times thicker than integrated circuit "thin films", and are made by entirely different processes that generally produce cracks, pores and other imperfections that would be ruinous to an integrated circuit but are of no consequence in optics and other macroscopic arts.

The term "active", when applied to an electronic element in an integrated circuit, means an element that alters its state in response to some electrical stimulus. This is to distinguish elements that form important functions in the electrical circuit, and therefore must be of high, reproducible quality, and elements that are removed from the integrated circuit before its completion, which merely serve to separate portions of the circuit or act as a packaging element for the circuit, which elements do not need to be of nearly as high and reproducible quality.

Figure 1:
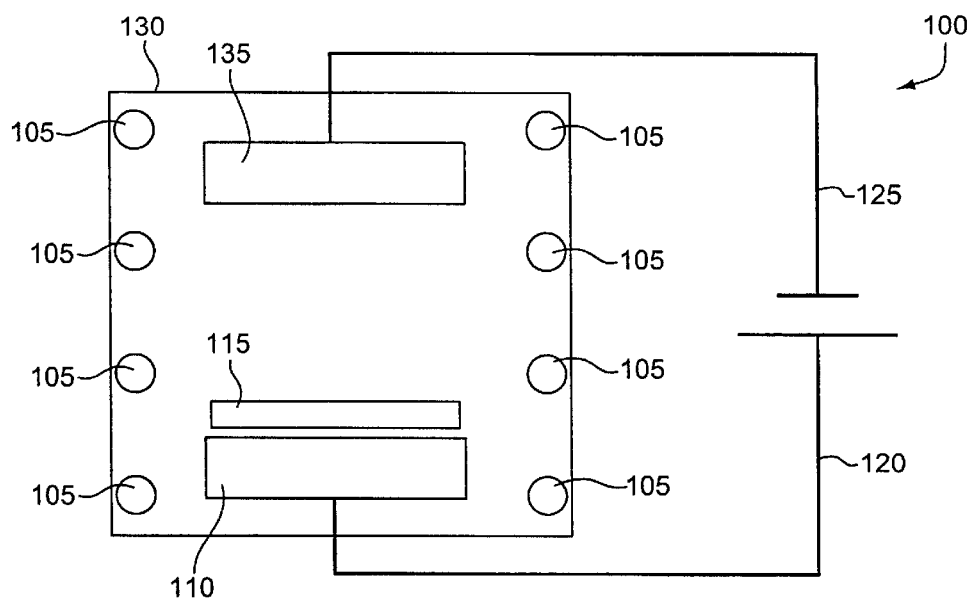
FIG. 1 shows an exemplary embodiment of an annealing device according to the invention.

FIG. 1 shows an exemplary embodiment of an annealing device 100 according to the invention. Integrated circuit substrate 115 is placed between a first electrode 110 and a second electrode 135 in an annealing device, such as furnace 130, prior to annealing the ferroelectric thin film material 315. A positive DC voltage 120 is applied to electrode 110 and a negative DC voltage 125 is applied to electrode 110. The voltage applied is preferably sufficient to align the polarization of the ferroelectric material in the direction of the electrical field. The heating elements 105 provide the heat necessary to anneal the ferroelectric material while the electrical field is supplied to the ferroelectric thin film material 315. In this disclosure, the term "substrate" is a general term including any one or number of layers of material on an underlying wafer, such as a silicon wafer, in addition to the silicon substrate itself, such as an adhesion layer, a diffusion buffer layer and electrodes deposited adjacent to the silicon substrate itself. That is, it is any object on which a layer of material is deposited using the process and apparatus of the invention.

Figure 2:
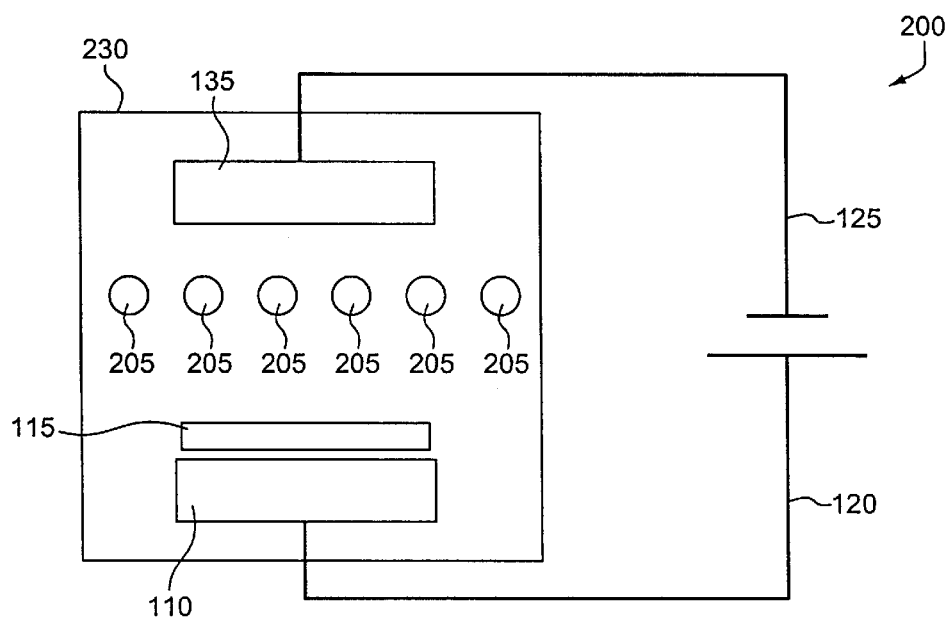
FIG. 2 shows an alternative embodiment of an annealing device according to the invention.

FIG. 2 shows an alternative embodiment of an annealing device 200 according to the invention. Integrated circuit substrate 115 is placed between a first electrode 110 and a second electrode 135 in an annealing device 200, such as a rapid thermal annealing device 230, prior to annealing the ferroelectric thin film material 315. A positive DC voltage 120 is applied to electrode 110 and a negative DC voltage 125 is applied to electrode 110. The voltage applied is preferably sufficient to align the polarization of the ferroelectric material in the direction of the electrical field. The rapid thermal anneal elements 205 provide the heat necessary to anneal the ferroelectric material while the electrical field is applied to substrate 115.

FIG. 3 shows an alternative embodiment of an annealing device 300 according to the invention. Ferroelectric thin film material 315 is deposited adjacent to first electrode 320 of an integrated circuit substrate 115 and is preannealed. Then top electrode 310, referred to herein as a top electrode, is deposited adjacent to the ferroelectric thin film material 315. Probe 330 is electrically connected to the top electrode 310 and probe 335 is electrically connected to the first, or bottom electrode 320. A positive DC voltage 120 is applied to probe 335 and a negative DC voltage 125 is applied to probe 330, preferably sufficient to polarize the ferroelectric thin film material 315 in the direction of the electrical field. Preferably, there is an area 340 of electrode 315, preferably near an edge of capacitor 350, where the ferroelectric thin film material 315 and the top electrode 310 are removed to expose bottom electrode 320. That is, the area 340 preferably comprises an edge 340 of the first or bottom electrode 320 that extends horizontally beyond the patterned precursor thin film 315 and the second or top electrode 310. This area 340 is where the electrode 320 connects to probe 335.

The terms "above", "upper", and "lower" herein mean relative to the substrate 115; which generally is a semiconductor, such as silicon, germanium, silicon germanium, gallium arsenide, etc., but may also be glass of some form or some other material. That is, if a second element is "above" a first element, it means it is farther from substrate 115, and if it is "below" another element, then it is closer to substrate 115 than the other element. The long dimension of substrate 115 defines a plane that is considered to be a "horizontal" plane herein, and directions perpendicular to this plane are considered to be "vertical".

Generally herein when electrodes are mentioned without specifying either the electrodes 110 and 135 of FIGS. 1 and 2 or the electrodes 310 and 320 of FIG. 3, it is intended that the process can be applied to any one of the arrangements of the three figures.

FIG. 4A is a flow chart showing an embodiment of a process for annealing a thin film ferroelectric material according to the invention. In 405, the precursor to the ferroelectric thin film material 315 is deposited on substrate 115, preferably in an enclosed deposition chamber. Optionally, at 407, the precursor thin film may be treated by drying, baking, annealing, exposing to vacuum, or exposing it to ultraviolet light to create either a less wet or a solid material. However, preferably, the treating act is skipped and, at 410, precursor coated substrate 115 is placed in an annealing apparatus, such as a furnace 130 or a rapid thermal annealing apparatus 230. This apparatus may be the same apparatus as that in which the deposition was done. That is, the deposition and annealing may be done in situ with or without physically moving the substrate. A first electrode 110 and second electrode 135 are provided in the annealing device. The orientation of the electrodes, 110 and 135, can be parallel to each other on a horizontal plane or parallel to each other on a vertical plane or parallel to each other in an orientation other than horizontal or vertical. The electrodes are electrically connected to an external DC voltage supply, 120 and 125. In 425, a positive DC voltage is applied to one of the electrodes and a negative DC voltage is applied to the other electrode. The voltage applied is preferably sufficient to align the polarization of the ferroelectric thin film material 315 in the direction of the electrical field. In act 430, the ferroelectric thin film precursor material is annealed while voltage is being applied to the electrodes. Annealing act 430 shall be referred to as a "first anneal" to distinguish it from a later annealing act. The first anneal is preferably performed in oxygen at a temperature of from 500° C. to 1000° C. for a time of from 30 minutes to 2 hours. First anneal 430 is more preferably performed at a temperature of from 600° C. to 850° C. for 80 minutes with the most preferred anneal temperature being about 700° C. First anneal 430 most preferably occurs in an oxygen atmosphere using an 80 minute "push" into the furnace and 5 minutes for the "pull" out of the furnace. The indicated anneal times include the time that is used to create thermal ramps into and out of the furnace. First anneal 430 is preferably performed at a temperature above the Curie temperature of the ferroelectric material. However, first anneal 430 may also be performed at a temperature below the Curie temperature of the ferroelectric material. The Curie temperature of the ferroelectric material is the temperature in which a transition between the ferroelectric phase and the paraelectric or normal dielectric phase of the ferroelectric material occurs.

In act 435, the electrical field is preferably left on while the ferroelectric thin film material 315 cools, although this act may be skipped. It is preferable that the electrical field is applied during act 430 and through act 435. In act 440, the electrical field is turned off. In act 445, the device is completed and evaluated. The completion generally entails patterning followed by a second anneal, the deposition of additional layers, ion etching of contact holes, metallization, and the addition of a capping layer, as well as other conventional procedures, as will be understood by those skilled in the art. If a second anneal is performed, it is preferably conducted in like manner with the first anneal in act 430. Preferably, in the second anneal, the annealing temperature is not varied by an amount greater than a small temperature range of from about 50° C. to 100° C. with respect to the first (e.g., 700° C.) annealing temperature. The time for the second anneal is preferably from about 10 minutes to 90 minutes in duration, and a duration of about 30 minutes is most preferred. It may be either a furnace anneal or a rapid thermal processing anneal, or both.

Figure 4B:
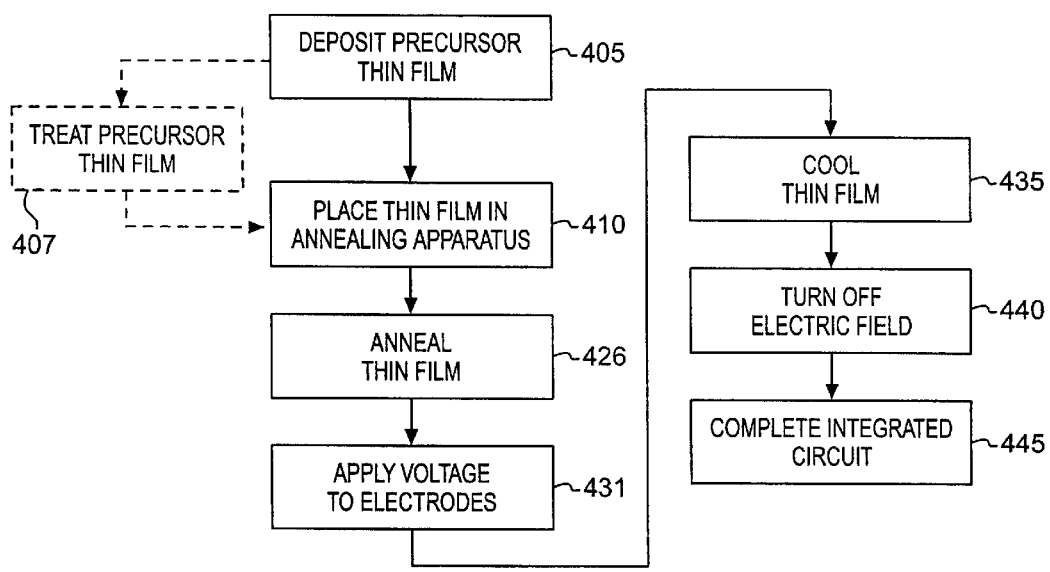
FIG. 4B is a flow chart showing a variation of the process of FIG. 4A for annealing a thin film ferroelectric material according to the invention.

FIG. 4B is a flow chart showing a variation of the process for annealing a thin film ferroelectric material according to the invention. Acts 405 through 410, and acts 435 through 445 are identical to those in FIG. 4A, so they will not be described further. In act 426, the ferroelectric thin film precursor material is annealed. Annealing 426 shall be referred to as a "first anneal" to distinguish it from a later annealing. The first anneal is preferably performed in oxygen at a temperature of from 500° C. to 1000° C. for a time of from 30 minutes to 2 hours. First anneal 426 is more preferably performed at a temperature of from 600° C. to 850° C. for 80 minutes with the most preferred anneal temperature being about 700° C. First anneal 426 most preferably occurs in an oxygen atmosphere using an 80 minute "push" into the furnace and 5 minutes for the "pull" out of the furnace. The indicated anneal times include the time that is used to create thermal ramps into and out of the furnace. First anneal 426 is preferably performed at a temperature above the Curie temperature of the ferroelectric material. However, first anneal 426 may also be performed at a temperature below the Curie temperature of the ferroelectric material. In act 431, a positive DC voltage is applied to one of the electrodes and a negative DC voltage is applied to the other electrode. The voltage applied is preferably sufficient to align the polarization of the ferroelectric thin film material 315 in the direction of the electrical field. In the embodiment of FIG. 4B, the electric field is applied only as the film cools.

Preferably, in either the embodiment of FIG. 4A or 4B, the field is left on until the film cools below the crystallization temperature. More preferably, the field is left on until the film cools below the Curie temperature. The field may be left on until the film cools to room temperature.

Figure 5:
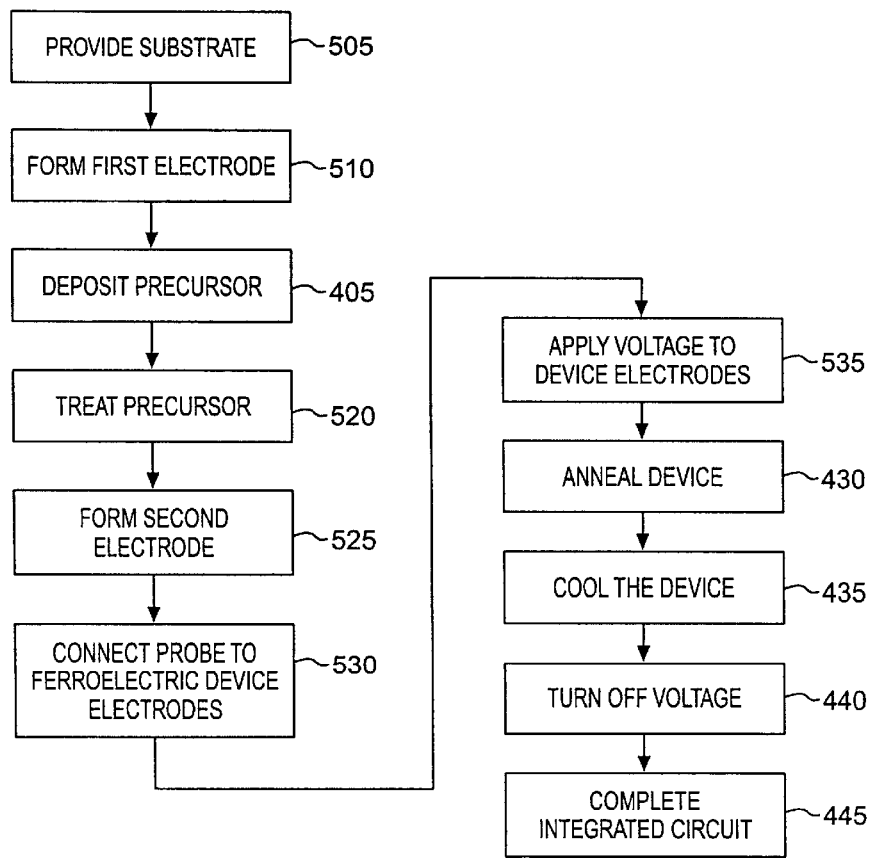
FIG. 5 is a flow chart showing an embodiment of a process for annealing a thin film ferroelectric material in a ferroelectric device according to the invention.

FIG. 5 is a flow chart showing an alternative embodiment of a process for annealing a thin film ferroelectric material in a ferroelectric device according to the invention. In act 505, a substrate 115 is provided, preferably in an enclosed deposition chamber. In act 510, a first electrode 320 is formed on substrate 115. In act 405, the precursor to the ferroelectric thin film material 315 is deposited on substrate 115. In act 520, precursor 315 is preferably treated. Treating preferably comprises of drying the precursor to the ferroelectric thin film material 315. Preferably, the drying takes place on a hot plate in a dry air atmosphere and at a temperature of from about 200° C. to 500° C. for a sufficient time duration to remove substantially all of the solvent and organic materials from the liquid thin film and leave a dried metal oxide residue. This period of time is preferably from about one minute to about thirty minutes. A 400° C. drying temperature for a duration of about 2 minutes to 10 minutes in air is most preferred. Optionally, treating may also include a process of heating to a temperature in the range of from 600° C. to 700° C., which we shall refer to as a soft anneal. The soft anneal may or may not go to a temperature above the crystallization temperature of the ferroelectric material. Treating may also include exposing to ultraviolet radiation or exposing to vacuum. Preferably, the dried residue is essentially the ferroelectric material in an amorphous state, although small microcrystals of the ferroelectric material may also be present. In act 525, a top electrode 310 is deposited, and then the dried precursor residue and electrode 310 are etched to expose an area 340 of first electrode 320. This area 340 of first electrode 320 is where probe 335 is connected to first electrode 320. In act 530, probe 330 is electrically connected to top electrode 310 and probe 335 is electrically connected to first electrode 320. In act 535, positive DC voltage is applied to probe 335 and negative DC voltage is applied to probe 330, although the sign of the voltages may be reversed. The voltage applied is preferably sufficient to align the polarization of the ferroelectric thin film material 315 to the electrical field. In act 430, the wafer including the dried residue is annealed to form the ferroelectric thin film material 315. This annealing is referred to as the "first anneal" to distinguish it from a later annealing act. The first anneal is preferably performed in oxygen at a temperature of from 500° C. to 1000° C. for a time of from 30 minutes to 2 hours. Act 520 is more preferably performed at a temperature of from 650° C. to 850° C. for 80 minutes with the most preferred anneal temperature being about 700° C. First anneal 430 most preferably occurs in an oxygen atmosphere using an 80 minute "push" into the furnace and 5 minutes for the "pull" out of the furnace. The indicated anneal times include the time that is used to create thermal ramps into and out of the furnace. In act 435, the electrical field is preferably left on while the ferroelectric thin film material 315 cools. It is preferable that the electrical field is applied during act 430 and through act 435. In act 440, the electrical field is turned off. In act 445, the device is completed and evaluated. The completion generally entails patterning followed by a second anneal act, the deposition of additional layers, ion etching of contact holes, metallization, and the addition of a capping layer, as well as other conventional procedures, as will be understood by those skilled in the art. An alternative embodiment to that of FIG. 5 similar to that of FIG. 4B may also be used, in which the voltage is applied to the electrodes 310 and 320 only as the film cools. Again, preferably, in either the embodiment of FIG. 5 or the alternative embodiment, the field is left on until the film cools below the crystallization temperature. More preferably, the field is left on until the film cools below the Curie temperature. The field may be left on until the film cools to room temperature.

Figure 6:
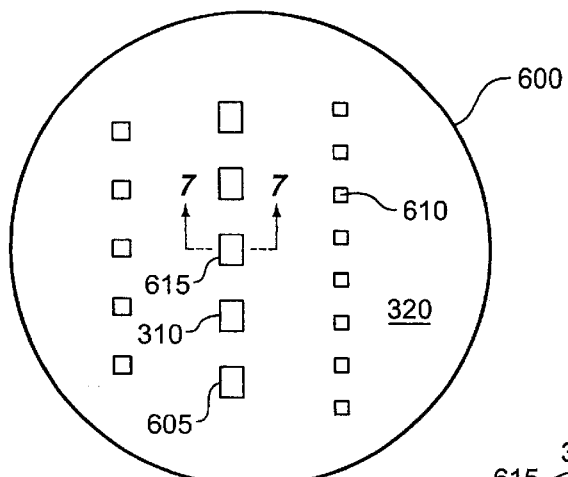
FIG. 6 is a top view of a wafer on which thin film capacitors fabricated by the process according to the invention are shown greatly enlarged.
Figure 7:
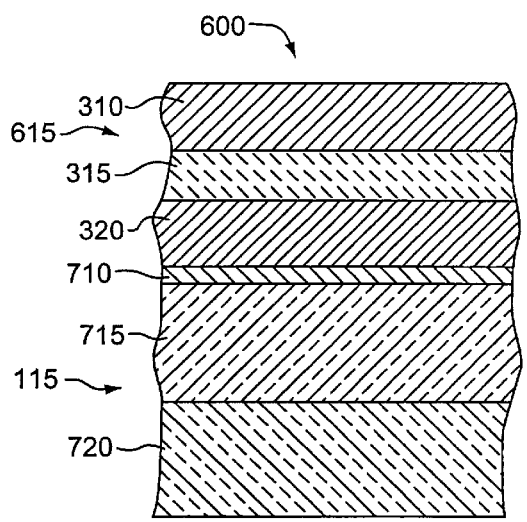
FIG. 7 is a portion of a cross-section of FIG. 6 taken through lines 7—7, illustrating a thin film capacitor device fabricated by the process according to the invention.

FIG. 6 is a top view of a wafer on which thin film capacitors fabricated by the process according to the invention are shown greatly enlarged. FIG. 7 is a portion of a cross-section of FIG. 6 taken through lines 7—7, illustrating a thin film capacitor device fabricated by the process according to the invention. A wafer 600 containing numerous capacitors 610, 605, 615, etc., is shown. FIG. 6 is a top view of the wafer 600 on which the thin film capacitors 610, 605, 615, etc., fabricated by the process according to the invention are shown greatly enlarged. FIG. 7 is a portion of a cross-section of FIG. 6 taken through lines 7—7 bisecting capacitor 615. Referring to FIG. 7, wafer 600 includes a silicon substrate 720, a silicon dioxide insulating layer 715, a thin layer of titanium 710, which assists the next layer, which is a platinum electrode 320, in adhering to the silicon dioxide 715, a layer of ferroelectric thin film material 315, and another platinum electrode 310.

Figure 8:
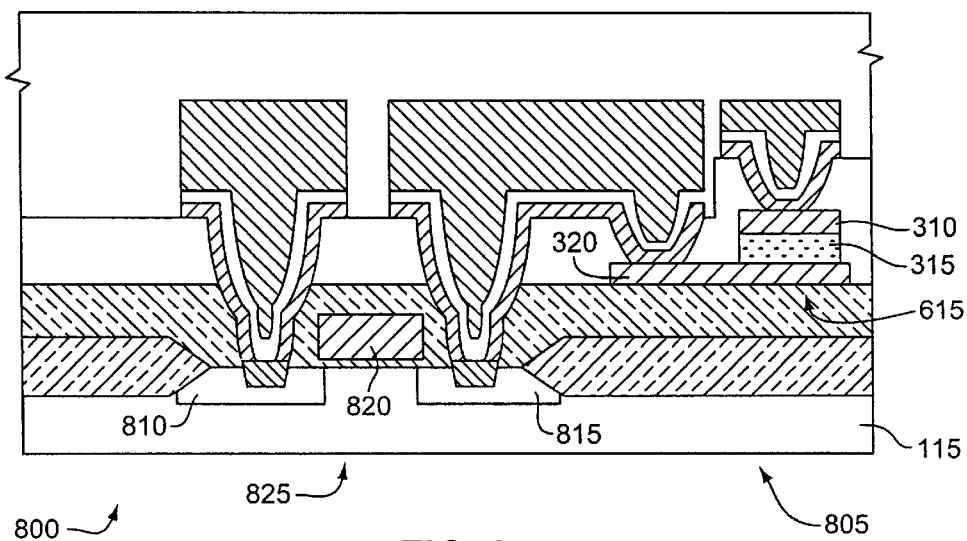
FIG. 8 shows a cross-sectional view of an integrated circuit fabricated by the process according to the invention.

FIG. 8 shows a cross-sectional view of an integrated circuit fabricated by the process according to the invention. It should be understood that the figures depicting the integrated circuit are not meant to be actual cross-sectional views of any particular portion of an actual semiconducting device, but are merely idealized representations which are employed to more clearly and fully depict the structure and process of the invention than would otherwise be possible. The portion of the integrated circuit 800 shown represents one memory cell 805 which includes a transistor 825 and a capacitor 615. Integrated circuit 800 includes a substrate 115, preferably a single crystal silicon wafer on which transistor 825 is formed. Transistor 825 comprises source/drain active areas 810 and 815, formed by doping areas of substrate 115, and gate 820. Capacitor 615 includes a first electrode 320, ferroelectric thin film material layer 315, and top electrode 310.

EXAMPLE 1

As an example of the method of the invention, an integrated circuit substrate 115 is placed between a first electrode 110 and a second electrode 135 in a furnace 130. In this example, substrate 115 may or may not have a top electrode 310 deposited adjacent to ferroelectric thin film material 315. First electrode 110 is electrically connected to a positive DC voltage 120 source. Second electrode 135 is electrically connected to a negative DC source 125. First electrode 110 and second electrode 135 are placed at a distance and orientation such that when voltage is applied to the electrodes, the electrical field generated is preferably sufficient to align the polarization of ferroelectric thin film material 315 in the direction of the electrical field. As the voltage is being applied to first electrode 110 and second electrode 135, furnace 130 is heated to a temperature sufficient to anneal ferroelectric thin film material 315. This annealing is referred to as the "first anneal" to distinguish it from a later annealing. The first anneal is preferably performed as described above.

EXAMPLE 2

As an example of the method of the invention, an integrated circuit substrate 115 is placed between a first electrode 110 and a second electrode 135 in a rapid thermal annealing device 230. In this example, substrate 115 may or may not have a top electrode 310 deposited adjacent to the ferroelectric thin film material 315. First electrode 110 is electrically connected to a positive DC voltage 120 source. Second electrode 135 is electrically connected to a negative DC source 125. First electrode 110 and second electrode 135 are placed at a distance and orientation such that when voltage is applied to the electrodes, the electrical field generated is preferably sufficient to align the polarization of ferroelectric thin film material 315 in the direction of the electrical field. As the voltage is being applied to first electrode 110 and second electrode 135, the rapid thermal annealing apparatus 230 is heated to a temperature sufficient to anneal ferroelectric thin film material 315. The first anneal is preferably performed as described above.

EXAMPLE 3

As an example of the method of the invention, a precursor to a ferroelectric thin film material 315 is deposited adjacent to the first electrode 320 of an integrated circuit substrate 115 and the precursor is treated as described above. Then a top electrode 310 is deposited adjacent to the ferroelectric thin film material 315. Top electrode 310 is deposited and top electrode 310 and film 315 are patterned to form the area 340. This area 340 is where the probe 335 is electronically connected to electrode 120. Probe 330 is electrically connected to top electrode 310 and probe 335 is electrically connected to first electrode 320. A positive DC voltage 120 is applied to probe 335 and a negative DC voltage 125 is applied to probe 330, preferably sufficient to polarize ferroelectric thin film material 315 in the direction of the electrical field. As the voltage is being applied to first electrode 320 and top electrode 310, the rapid thermal annealing apparatus 230 is heated to a temperature sufficient to anneal ferroelectric thin film material 315. The first anneal is preferably performed in oxygen at a temperature of from 500° C. to 1000° C. for a time of from 30 minutes to 2 hours. Act 430 is more preferably performed at a temperature of from 600° C. to 850° C. for 80 minutes with the most preferred anneal temperature being about 700° C. The first anneal 430 most preferably occurs in an oxygen atmosphere using an 80 minute "push" into the furnace and 5 minutes for the "pull" out of the furnace. The "pull" out of the furnace requires a "pull" rate no faster than the time required for the ferroelectric thin film material to crystallize in the electrical field.

EXAMPLE 4

As an example of the method of the invention, an integrated circuit substrate 115 is placed between a first electrode 110 and a second electrode 135 in a furnace 130. In this example, substrate 115 may or may not have a top electrode 310 deposited adjacent to the material 315. The material 315 may either be a precursor to the ferroelectric material, or the ferroelectric material. If a precursor material, it may be either liquid, a solid amorphous material, or a solid crystalline material. First electrode 110 is electrically connected to a positive DC voltage 120 source. Second electrode 135 is electrically connected to a negative DC source 125. First electrode 110 and second electrode 135 are placed at a distance and orientation such that when voltage is applied to the electrodes, the electrical field generated is preferably sufficient to align the polarization of ferroelectric thin film material 315 in the direction of the electrical field. As the voltage is being applied to first electrode 110 and second electrode 135, the furnace 130 is heated to a temperature above the Curie temperature of ferroelectric thin film material 315. This annealing act is referred to as the "first anneal" to distinguish it from a later annealing act. The first anneal is preferably performed as described above.

EXAMPLE 5

As an example of the method of the invention, an integrated circuit substrate 115 is placed between a first electrode 110 and a second electrode 135 in a furnace 130. In this example, substrate 115 may or may not have a top electrode 310 deposited adjacent to the material 315. The material 315 may either be a precursor to the ferroelectric material, or the ferroelectric material. If a precursor material, it may be either liquid, a solid amorphous material, or a solid crystalline material. First electrode 110 is electrically connected to a positive DC voltage 120 source. Second electrode 135 is electrically connected to a negative DC source 125. First electrode 110 and second electrode 135 are placed at a distance and orientation such that when voltage is applied to the electrodes, the electrical field generated is preferably sufficient to align the polarization of ferroelectric thin film material 315 in the direction of the electrical field. As the voltage is being applied to first electrode 110 and second electrode 135, the furnace 130 is heated to a temperature below the Curie temperature of ferroelectric thin film material 315.

This annealing is referred to as the "first anneal" to distinguish it from a later annealing. The first anneal is preferably performed as described above.

EXAMPLE 6

As an example of the method of the invention, an integrated circuit substrate 115 is placed between a first electrode 110 and a second electrode 135 in a furnace 130. In this example, substrate 115 may or may not have a top electrode 310 deposited adjacent to ferroelectric thin film material 315. First electrode 110 is electrically connected to a positive DC voltage 120 source. Second electrode 135 is electrically connected to a negative DC source 125. First electrode 110 and second electrode 135 are placed at a distance and orientation such that when voltage is applied to the electrodes, the electrical field generated is preferably sufficient to align the polarization of ferroelectric thin film material 315 in the direction of the electrical field. Furnace 130 is heated to a temperature sufficient to anneal ferroelectric thin film material 315 above the crystallization temperature of the ferroelectric thin film material 315. The furnace 130 is allowed to cool, and voltage is applied to the first electrode 110 and the second electrode 135, while the ferroelectric thin film material 315 is above the crystallization temperature. The voltage is turned off once the thin film material 315 reaches room temperature.

EXAMPLE 7

As an example of the method of the invention, an integrated circuit substrate 115 is placed between a first electrode 110 and a second electrode 135 in a rapid thermal annealing device 230. In this example, substrate 115 may or may not have a top electrode 310 deposited adjacent to the ferroelectric thin film material 315. First electrode 110 is electrically connected to a positive DC voltage 120 source. Second electrode 135 is electrically connected to a negative DC source 125. First electrode 110 and second electrode 135 are placed at a distance and orientation such that when voltage is applied to the electrodes, the electrical field generated is preferably sufficient to align the polarization of ferroelectric thin film material 315 in the direction of the electrical field. Rapid thermal annealing device 230 is heated to a temperature sufficient to anneal ferroelectric thin film material 315 above the Curie temperature of the ferroelectric thin film material 315. The rapid thermal annealing device 230 is allowed to cool, and voltage is applied to the first electrode 110 and the second electrode 135, while the ferroelectric thin film material 315 is above the Curie temperature. The voltage is turned off once the thin film material 315 reaches room temperature.

EXAMPLE 8

As an example of the method of the invention, an integrated circuit substrate 115 is placed between a first electrode 110 and a second electrode 135 in a rapid thermal annealing device 230. In this example, substrate 115 may or may not have a top electrode 310 deposited adjacent to the ferroelectric thin film material 315. First electrode 110 is electrically connected to a positive DC voltage 120 source. Second electrode 135 is electrically connected to a negative DC source 125. First electrode 110 and second electrode 135 are placed at a distance and orientation such that when voltage is applied to the electrodes, the electrical field generated is preferably sufficient to align the polarization of ferroelectric thin film material 315 in the direction of the electrical field. Rapid thermal annealing device 230 is heated to a temperature sufficient to anneal the ferroelectric thin film material 315 just below the Curie temperature of the ferroelectric thin film material 315. The rapid thermal annealing device 230 is allowed to cool, and voltage is applied to the first electrode 110 and the second electrode 135, while the ferroelectric thin film material 315 is just below the Curie temperature. The voltage is turned off once the thin film material 315 reaches room temperature.

There has been described what is at present considered to be the preferred embodiments of the present invention. It should be understood the invention can be embodied in other specific forms without departing from the spirit or essential characteristics thereof. The present embodiments are, therefore, to be considered in all aspects as illustrative and not restrictive. The scope of the invention is indicated by the appended claims rather than the foregoing description.

What is claimed is:

1. A method of fabricating an integrated circuit, said method comprising the acts of:
   providing an integrated circuit substrate;
   depositing a precursor thin film on said integrated circuit substrate, said precursor thin film comprising either a ferroelectric material or a precursor to a ferroelectric material;
   applying a DC electric field to said precursor thin film;
   annealing said precursor thin film during said application of said DC electric field to form a solid ferroelectric thin film; and
   completing the fabrication of said integrated circuit to include at least a portion of said solid ferroelectric thin film in an electrical component of said integrated circuit.

2. A method as in claim 1 wherein said solid ferroelectric thin film is an active material in said integrated circuit.

3. A method as in claim 1 wherein said act of applying a DC electric field comprises creating a DC electric field sufficient to align the polarization direction of said ferroelectric thin film with said DC electric field.

4. A method as in claim 1 wherein said act of annealing comprises heating said precursor thin film to a temperature above the crystallization temperature of said ferroelectric material.

5. A method as in claim 1 wherein said act of annealing comprises heating said precursor thin film to a temperature above the Curie temperature of said ferroelectric material.

6. A method as in claim 1 wherein said act of annealing comprises heating said precursor thin film to a temperature below the Curie temperature of said ferroelectric material.

7. A method as in claim 4 and further including the act of cooling the ferroelectric thin film below the crystallization temperature of the ferroelectric material while applying said DC electric field.

8. A method as in claim 1 wherein said act of annealing comprises annealing in a furnace.

9. A method as in claim 1 wherein said act of annealing comprises annealing in a rapid thermal anneal apparatus.

10. A method as in claim 1 wherein said integrated circuit comprises a ferroelectric memory.

11. A method as in claim 10 wherein said ferroelectric memory comprises a ferroelectric capacitor.

12. A method as in claim 10 wherein said ferroelectric memory comprises a ferroelectric field effect transistor.

13. A method as in claim 1 wherein said act of applying a DC electric field comprises:
   providing an annealing apparatus having a first electrode and a second electrode;
   placing said integrated circuit substrate between said electrodes; and
   applying a DC voltage to said electrodes.

14. A method as in claim 13 wherein said annealing apparatus comprises an annealing chamber and said act of applying said DC voltage comprises generating said DC voltage external to said annealing chamber and applying said DC voltage to said electrodes in said annealing chamber.

15. A method as in claim 1 wherein said act of providing an integrated circuit substrate comprises providing a first electrode and said act of depositing comprises depositing said precursor thin film on said first electrode, and further comprising the act of depositing a second electrode on said precursor thin film, and wherein said act of applying a DC electric field comprises applying a DC voltage between said first and second electrodes.

16. A method as in claim 15 and further including the act of patterning said precursor thin film and said second electrode so that an area of said first electrode is exposed and said act of applying a DC voltage comprises contacting said area with a power probe.

17. A method as in claim 16 wherein said area extends horizontally beyond said patterned precursor thin film and said second electrode.

18. A method as in claim 15 and further including the act of preannealing said precursor thin film prior to said act of depositing said second electrode.

19. A method as in claim 15 wherein said act of providing an integrated circuit substrate further comprises providing a semiconductor substrate and said first electrode is located between said precursor thin film and said semiconductor substrate.

20. A method as in claim 1 wherein said precursor to said ferroelectric material is a solid.

21. A method as in claim 1 wherein said precursor to said ferroelectric material is a liquid.

22. A method of fabricating an integrated circuit, said method comprising the acts of:
   annealing a partially completed integrated circuit including a precursor thin film, said precursor thin film comprising a ferroelectric material or precursor to said ferroelectric material;
   applying a DC electric field to said annealed precursor thin film as it cools to form a ferroelectric thin film; and
   completing the fabrication of said integrated circuit to include at least a portion of said ferroelectric thin film in an electrical component of said integrated circuit.

23. A method as in claim 22 wherein said act of applying comprise creating a DC electric field sufficient to align the polarization direction of said ferroelectric thin film with said DC electric field.

24. A method as in claim 22 wherein said act of annealing comprises heating said precursor thin film to a temperature above the crystallization temperature of said ferroelectric material.

25. A method as in claim 22 wherein said act of annealing comprises heating said precursor thin film to a temperature above the Curie temperature of said ferroelectric material.

26. A method as in claim 22 wherein said act of annealing comprises heating said precursor thin film to a temperature below the Curie temperature of said ferroelectric material.

27. A method as in claim 22 wherein said precursor to said ferroelectric material is a solid.

28. A method as in claim 22 wherein said precursor to said ferroelectric material is a liquid.

29. A method as in claim 22 wherein said act of annealing comprises annealing in a furnace.

30. A method as in claim 22 wherein said act of annealing comprises annealing in a rapid thermal anneal apparatus.

31. A method as in claim 22 wherein said DC electric field is applied until said film cools to the Curie temperature of said ferroelectric thin film or below.

32. A method as in claim 22 wherein said DC electric field is applied until said film cools to the crystallization temperature of said ferroelectric thin film or below.

33. A method as in claim 22 wherein said DC electric field is applied until said film cools to room temperature.

34. A method as in claim 22 wherein said act of annealing comprises annealing in a furnace.

35. A method as in claim 22 wherein said act of annealing comprises annealing in a rapid thermal anneal apparatus.

36. A method as in claim 22 where said act of applying comprises:
   providing a pair of electrodes; and
   applying a DC voltage to said electrodes.

37. A method as in claim 22 wherein said act of applying comprises: providing a first electrode, depositing said ferroelectric material or precursor to said ferroelectric material on said first electrode, and depositing a second electrode on said thin film, and applying a DC voltage between said first and second electrodes.

* * * * *